US012592541B2

(12) United States Patent
Bader et al.

(10) Patent No.: US 12,592,541 B2
(45) Date of Patent: Mar. 31, 2026

(54) METHOD OF CONTROLLING AN OPTICAL OUTPUT POWER OF A LASER DIODE, CONTROL DEVICE AND SYSTEM

(71) Applicants: TRUMPF Photonic Components GmbH, Ulm (DE); Robert Bosch GmbH, Stuttgart (DE)

(72) Inventors: Sven Bader, Ulm (DE); Robert Wolf, Reutlingen (DE)

(73) Assignee: ROBERT BOSCH GMBH, Gerlingen (DE)

( * ) Notice: Subject to any disclaimer, the term of this patent is extended or adjusted under 35 U.S.C. 154(b) by 918 days.

(21) Appl. No.: 17/873,232

(22) Filed: Jul. 26, 2022

(65) Prior Publication Data

US 2022/0368103 A1 Nov. 17, 2022

Related U.S. Application Data

(63) Continuation of application No. PCT/EP2021/051678, filed on Jan. 26, 2021.

(30) Foreign Application Priority Data

Jan. 30, 2020 (EP) .................................... 20154699

(51) Int. Cl.
*H01S 5/068* (2006.01)
*H01S 5/00* (2006.01)
(Continued)

(52) U.S. Cl.
CPC ........ *H01S 5/06808* (2013.01); *H01S 5/0264* (2013.01); *H01S 5/0683* (2013.01); *H01S 5/0021* (2013.01); *H01S 5/183* (2013.01)

(58) Field of Classification Search
CPC .. H01S 5/06808; H01S 5/0264; H01S 5/0683; H01S 5/0021; H01S 5/183
See application file for complete search history.

(56) References Cited

U.S. PATENT DOCUMENTS

| | | | |
|---|---|---|---|
| 5,019,769 A | 5/1991 | Levinson |
| 5,757,837 A | 5/1998 | Lim et al. |
| (Continued) | | | |

FOREIGN PATENT DOCUMENTS

| | | |
|---|---|---|
| CN | 109565150 A | 4/2019 |
| DE | 102015207289 A1 | 10/2016 |
| (Continued) | | |

*Primary Examiner* — M. A. Golub-Miller
(74) *Attorney, Agent, or Firm* — LEYDIG, VOIT & MAYER, LTD.

(57) ABSTRACT

A method of controlling an optical output power of a laser diode associated with a photodiode includes obtaining first optical trimming parameters indicative of a first optical output power of the laser diode at a first laser diode current and a second optical output power of the laser diode at a second laser diode current above lasing threshold. Next, second electrical trimming parameters indicative of a photodiode characteristic curve of photodiode current versus laser diode current are obtained. A first photodiode current and a second photodiode current at a laser diode currents below lasing threshold. A slope of a photodiode current versus laser diode current is determined. The optical output power of the laser diode above lasing threshold is controlled based on the first optical trimming parameters, the second electrical trimming parameters and the slope of the photodiode current versus laser diode current below lasing threshold.

16 Claims, 7 Drawing Sheets

(51) Int. Cl.
 *H01S 5/026* (2006.01)
 *H01S 5/0683* (2006.01)
 *H01S 5/183* (2006.01)

(56) References Cited

U.S. PATENT DOCUMENTS

| | | | | |
|---|---|---|---|---|
| 6,195,370 | B1 | 2/2001 | Haneda et al. | |
| 6,483,862 | B1 | 11/2002 | Aronson et al. | |
| 8,976,826 | B2 * | 3/2015 | Locklin | H01S 5/0683 |
| | | | | 372/38.07 |
| 9,857,287 | B2 | 1/2018 | Dittrich et al. | |
| 2003/0091076 | A1 * | 5/2003 | Fischer | H01S 5/042 |
| | | | | 372/38.02 |
| 2004/0109696 | A1 * | 6/2004 | Toshihisa | H04B 10/503 |
| | | | | 398/198 |
| 2007/0116076 | A1 | 5/2007 | Wang et al. | |
| 2007/0280702 | A1 | 12/2007 | Kijima et al. | |
| 2010/0246614 | A1 * | 9/2010 | Koshi | H01S 5/0687 |
| | | | | 372/20 |
| 2018/0019823 | A1 | 1/2018 | Redman-White et al. | |
| 2019/0131769 | A1 * | 5/2019 | Weida | G01J 3/108 |
| 2020/0036157 | A1 | 1/2020 | Wolf et al. | |

FOREIGN PATENT DOCUMENTS

| | | | |
|---|---|---|---|
| DE | 102018212687 | A1 | 1/2020 |
| EP | 2071568 | A1 | 6/2009 |
| EP | 3651290 | A1 | 5/2020 |
| JP | H08139869 | A | 5/1996 |

* cited by examiner

500

Obtain first optical trimming parameters — S501

Obtain second optical trimming parameters — S502

Measure first photodiode current — S503

Determine slope of photodiode current versus laser diode current — S504

Control optical output power — S505

METHOD OF CONTROLLING AN OPTICAL OUTPUT POWER OF A LASER DIODE, CONTROL DEVICE AND SYSTEM

CROSS REFERENCE TO RELATED APPLICATIONS

This application is a continuation of International Application No. PCT/EP2021/051678 (WO 2021/151860 A1), filed on Jan. 26, 2021, and claims benefit to European Patent Application No. EP 20154699.1, filed on Jan. 30, 2020. The aforementioned applications are hereby incorporated by reference herein.

FIELD

The present invention relates to the field of optical particle sensing and in particular to a method of controlling an optical output power of a laser diode device. The present invention furthermore relates to a respective control device and a system, in particular a particle sensor apparatus, comprising a control device adapted to control an optical output power of the laser diode.

BACKGROUND

DE 10 2015 207 289 A1 and U.S. Pat. No. 9,857,287 B2 disclose a particle sensor apparatus. The particle sensor apparatus comprises an optical emitter device that is configured to emit an optical radiation so that a volume having at least one particle possibly present therein is at least partly illuminable; an optical detector device having at least one detection surface that is struck by at least a portion of the optical radiation scattered at the at least one particle, at least one information signal regarding an intensity and/or an intensity distribution of the optical radiation striking the at least one detection surface being outputtable; and an evaluation device with which an information item regarding a presence of particles, a number of particles, a particle density, and/or at least one property of particles is identifiable and outputtable, the particle sensor apparatus also encompassing at least one lens element that is disposed so that the emitted optical radiation is focusable onto a focus region inside the volume.

The optical particle sensor apparatus may comprise a VCSEL (vertical cavity surface emitting laser) laser diode having an integrated photodiode. A VCSEL is a type of semiconductor laser diode with laser beam emission perpendicular from the top surface, contrary to conventional edge-emitting semiconductor lasers (also in-plane lasers) which emit from surfaces formed by cleaving the individual chip out of a wafer. Based on the so-called self-mixing interference (SMI) technique, the known optical particle sensor apparatus allows to obtain information regarding the presence of particles and optionally their velocity.

The optical particle sensor device should be operated with well-defined output power. On the one hand, the optical output power should be as high as possible for high measurement sensitivity. On the other hand, the optical output power should be sufficiently low to ensure eye-safe operation.

However, the optical output power may change during operation of the laser diode at constant laser diode current based on a temperature of the laser diode and aging effects of the laser diode over device lifetime.

Hence, it may be necessary to control the actual output power to a desired or target output power during operation, for example, by adjusting a laser diode current. The laser diode current may also be referred to as drive current. In principle, the optical output power of the laser diode may be measured via an external optical feedback path. However, in particular for miniaturized applications such as an optical particle sensor integrated in a smartphone, this may not be practical.

The German patent application with the filing number DE 10 2018 212 687.9 discloses a method for monitoring an optical output power of a laser diode with associated photodiode, and a particle sensor device. This application describes the general idea of monitoring the optical output power during operation of the laser diode based on current and/or voltage measurements at the laser diode, and at the photodiode during operation. More precisely, it is suggested to perform (a) a voltage measurement at the laser diode at a predetermined laser diode current of e.g. 10 µA and (b) several current measurements of the photodiode current at different set laser diode currents.

While the method disclosed therein may already provide very good performance for monitoring the optical output power of the laser diode, it would be desirable to obtain a further improved and preferably simplified method of controlling an optical output power of a laser diode with integrated photodiode.

U.S. Pat. No. 6,483,862 B1 discloses a system and method for the monolithic integration of a light emitting device and a photodetector using a native oxide semiconductor layer. A light emitting device and photodetector combination having a structure in which the layer of the photodetector that contacts the light emitting device is separated from the light emitting device by a native semiconductor oxide layer that is both insulating and has a refractive index lower than that of the light emitting device and the photodetector is provided. This configuration shall result in a light emitting device and photodetector structure that minimizes the capture of the spontaneous emission light output from the light emitting device by the photodetector while electrically isolating the light emitting device from the photodetector. The electrical isolation of the light emitting device from the photodetector shall result in a four terminal device in which the light emitting device and photodetector may be independently biased, and can therefore be operated at a very low bias voltage.

U.S. Pat. No. 5,757,837 A discloses a vertical-cavity surface emitting laser constructed with an intracavity quantum well photodetector. The quantum well photodetector is placed at an optical intensity peak at the Fabry-Perot wavelength. The device may include a current confinement layer in the form of an oxidation layer, an air gap, or proton implantation.

SUMMARY

In an embodiment, the present disclosure provides a method of controlling an optical output power of a laser diode associated with a photodiode includes obtaining first optical trimming parameters indicative of a first optical output power of the laser diode at a first laser diode current and a second optical output power of the laser diode at a second laser diode current above lasing threshold. Next, second electrical trimming parameters indicative of a photodiode characteristic curve of photodiode current versus laser diode current are obtained. A first photodiode current and a second photodiode current at a laser diode currents below lasing threshold. A slope of a photodiode current versus laser diode current is determined. The optical output power of the laser diode above lasing threshold is controlled based on the first optical trimming parameters, the second electrical trimming parameters and the slope of the photodiode current versus laser diode current below lasing threshold.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
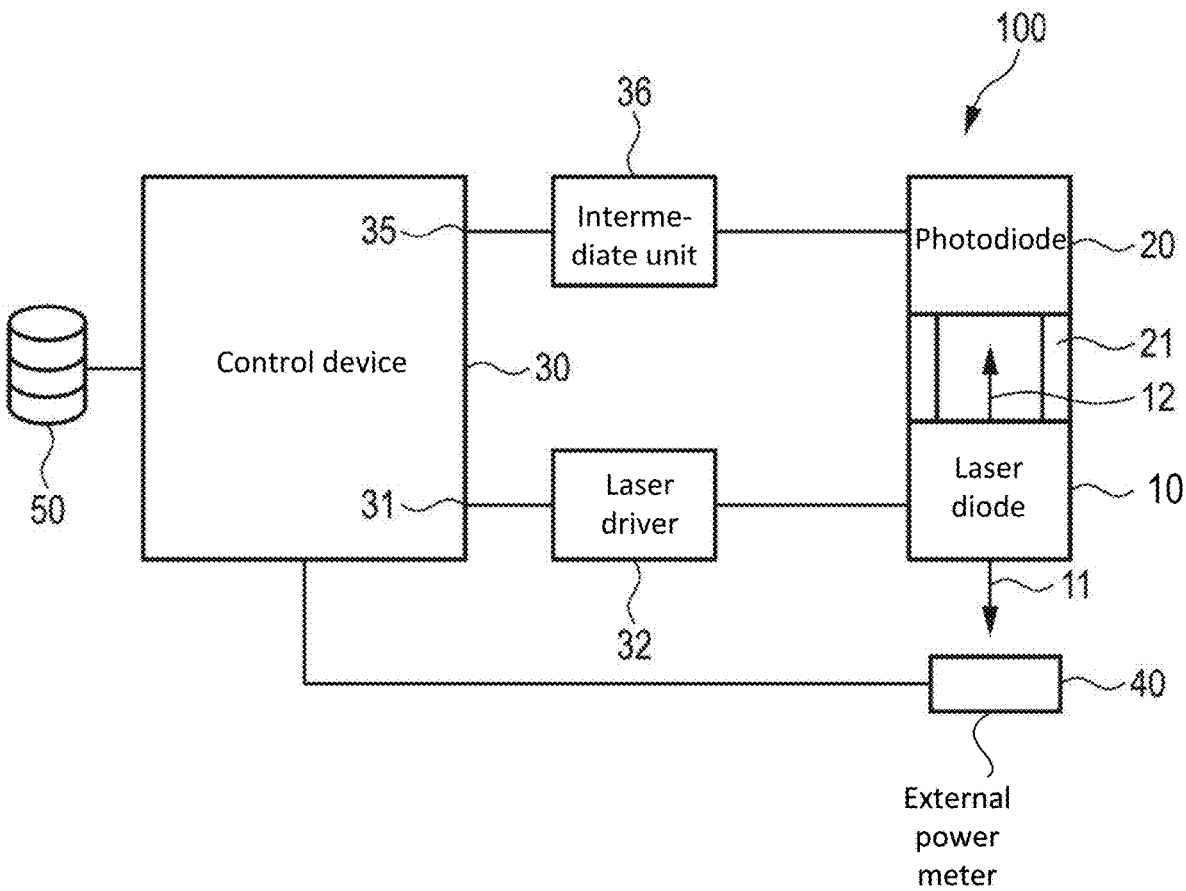
FIG. 1 shows a schematic diagram of a system according to an aspect of the present disclosure.

Accordingly, it is an object of the present invention to provide a further improved method for controlling an optical output power of a laser diode. In particular, it would be advantageous to provide a method that may provide simplified adjustment regarding temperature and/or aging effects during operation in the field. In particular, a control method, wherein a circuit design may be simplified, would be advantageous. Further, it would be desirable that a setup or calibration procedure may be more time-efficient during operation in the field.

According to a first aspect of the present disclosure a method of controlling an optical output power of a laser diode is presented, wherein the laser diode is associated with a photodiode, wherein the photodiode converts light received from the laser diode into an electrical photodiode current; the method comprising the steps of:

obtaining first optical trimming parameters indicative of a first optical output power of the laser diode at a first laser diode current above lasing threshold under predetermined calibration conditions (also referred to as predetermined conditions in the present disclosure), and a second optical output power of the laser diode at a second laser diode current different from the first laser diode current above lasing threshold under the predetermined conditions;

obtaining second electrical trimming parameters indicative of a photodiode characteristic curve of photodiode current versus laser diode current under the predetermined conditions;

measuring a first photodiode current at a third laser diode current below lasing threshold (during spontaneous emission of the laser diode);

measuring a second photodiode current at a fourth laser diode current different from the third laser diode current below lasing threshold;

determining a slope of a photodiode current versus laser diode current based on said measurement of the first photodiode current, and said second photodiode current below lasing threshold;

controlling the optical output power of the laser diode above lasing threshold, based on the first optical trimming parameters, the second electrical trimming parameters, and the slope of the photodiode current versus laser diode current below lasing threshold.

In yet further aspects of the present invention, there are provided a corresponding control device for controlling an optical output power of a laser diode, and a system, in particular an optical particle sensor device, comprising a photodiode, a laser diode and a control device adapted to control an optical output power of the laser diode based on a method as described herein.

Preferred embodiments of the invention are defined in the dependent claims. It shall be understood that the claimed method, system, and control device may have similar, and/or identical preferred embodiments as the method, in particular as defined in the dependent claims, and as disclosed herein.

The herein presented solutions may provide a possibility to further improved power control of the laser diode, while it may provide simplified adjustment regarding temperature, and/or aging effects during operation in the field.

The inventors recognized that optical output power of the laser diode above lasing threshold may be controlled with high accuracy based on the slope of photodiode current versus laser diode current below lasing threshold. Hence, even though it may seem counterintuitive to control the output power of the laser above the laser threshold based on the slope of the photodiode characteristic curve below laser threshold, it has been found that power control with high accuracy can be achieved over a range of different optical output powers above laser threshold. For example, the effect of nonlinearities of characteristic curve of the photodiode above laser threshold can be reduced.

Referring to the aforementioned DE 10 2018 212 687.9, therein, it is suggested to evaluate PDSlope and PDSlopeT describing the slope of the photodiode characteristic curve above laser threshold.

Moreover, it has been found that the effort for calibration measurements during operation in the field may be further reduced by providing first optical trimming parameters indicative of a first optical output power of the laser diode at a first laser diode current, and a second optical output power of the laser diode at a second laser diode current different from the first laser diode current, above lasing threshold under predetermined conditions. Even though the effort obtaining trimming parameters is increased, these trimming parameters can enable a simplified subsequent calibration during operating stage. For example, it has been found that an additional voltage measurement of at the laser diode may no longer be needed during operation in the field. Hence, even though the effort during trimming stage is increased, the overall effort may be reduced. It should be noted that a trimming measurement is usually performed as a one-time measurement during manufacturing under predetermined conditions, whereas temperature adjustments, and/or adaptations regarding device aging effects occur frequently over device lifetime.

The proposed solution may provide several advantages over the approach described in the earlier German patent application DE 10 2018 212 687.9. For example, therein, the abcd constants may merely apply when the power level during operation in the field corresponds to a predetermined power level during calibration, for example, when an optical output power of 0.5 mW is set. While this approach provides very good calibration results during operation in the field for setting this particular power level, the performance and flexibility for setting different power levels may be further improved with the concepts described in the present disclosure.

Further advantages of the proposed solution may involve a more accurate power control in view of burn-in effects of the laser diode. It has been found that in particular during the first operating hours of the laser diode the measurement accuracy of conventional approaches may provide an inferior performance. To overcome this problem, prior art approaches may perform a calibration measurement after sufficient operating time of the laser diodes during manufacturing. The proposed solution may thus reduce the calibration time during manufacturing, since it may not be needed to wait for burn-in effects to set in during calibration in manufacturing.

Generally speaking, the proposed method can be divided into two stages: a trimming stage and an operation stage. The trimming stage refers to trimming or calibration under predetermined, i.e. controlled or defined conditions, for example during manufacturing. The trimming stage can comprise obtaining the first and second optical trimming parameters. If The first optical trimming parameters are indicative of at least a first optical output power of the laser diode at a first laser diode current above lasing threshold and a second optical output power of the laser diode at a second laser diode current, different from the first laser diode current above lasing threshold. Optionally, the optical trimming parameters may comprise or may be derived from a characteristic curve of the laser diode. The actual measurement of the first photodiode current and of the second photodiode, as well as the subsequent determining and controlling steps may be performed during the operating stage. As used herein, trimming parameters may refer to calibration parameters and the terms trimming parameters, calibration parameters and trimming calibration parameters may be used interchangeably. Similarly, predetermined conditions may refer to calibration conditions and the terms predetermined conditions, calibration conditions or predetermined calibration conditions may be used interchangeably. As explained above, one has to distinguish between (1) calibration or trimming under predetermined conditions (trimming stage) and (2) operation of the device in the field (operation stage), i.e., away from the laboratory or manufacturing equipment and not necessarily under known conditions. The steps of measuring the first and second photodiode currents, determining the slope of a photodiode current versus laser diode current based thereon, and controlling the optical output power of the laser diode are performed during operating stage. During operating stage not extensive optical measurements are necessary. While it is acceptable that extensive device calibration or trimming parameters may be measured during manufacturing under predetermined calibration conditions (e.g. one-time calibration measurement), the required remaining measurements during operation in the field should be simple and limited. Hence, during operation, the predetermined calibration or trimming parameters may be obtained, e.g. from a storage, and used in combination with limited additional measurements.

In the following, some terms which are used throughout the application, shall be shortly explained and defined:

Obtaining trimming parameters may refer to receiving, retrieving, determining or measuring the trimming parameters. For example, the trimming parameters may already be stored in a database, and retrieved from a databased within the device. The trimming parameters may also be received via an optional communication interface. It is also possible that the trimming parameters have to be measured as part of the method. Moreover, the trimming parameters may be calculated from measurement values of the first and second optical output powers. Similar considerations apply accordingly regarding the second electrical trimming parameters.

A characteristic curve of the photodiode may refer to a curve describing the photodiode current versus the laser diode current. A photodiode slope or slope of the photodiode (curve) may refer to a slope of the characteristic curve of the photodiode. A characteristic curve of the laser diode may refer to a curve of the optical output power of the laser diode versus the laser diode current. A laser diode slope or slope of the laser diode (curve) may refer to a slope of the characteristic curve of the laser diode. A slope can be determined by measuring the output power or photocurrent at two different laser diode currents.

In the following, advantageous embodiments of the method according to an aspect of the invention will be described.

According to an embodiment, obtaining the first optical trimming parameter may comprise measuring a characteristic curve of the laser diode indicative of an optical output power of the laser diode versus a laser diode current of the laser diode. In particular, the optical output power may be measured with a (calibrated) external powermeter. Hence, the respective values can be obtained with very high accuracy during manufacturing. In view that the trimming measurement can be performed as a one-time measurement during manufacturing, a high precision measurement with dedicated external equipment is feasible. In addition or in the alternative, the parameters may also be stored in a memory, and obtained from said memory. Further, the optical output may be measured with the photodiode associated with the laser diode, e.g. during manufacturing or when it is determined that the device is operated under predetermined conditions for calibration. For example a calibration measurement may be performed with the photodiode associated with the laser diode when it is determined that the device is at a desired temperature for performing calibration.

The first optical trimming parameters may comprise an optically determined trimming laser diode slope $(LD_{Slope\_trim\_opt})$ of a laser diode characteristic curve indicative of an optical output power of the laser diode versus a laser diode current of the laser diode under the predetermined conditions. An advantage of this approach can be that power control over device lifetime may be further improved. Hence, instead of using an electrically determined slope, derived from the photodiode, the laser diode slope can be determined, based on an optical measurement of the optical output power of the laser diode. Even though the electrically determined value and the optically determined value are rather similar, it has been found that more precise power control can be achieved over device lifetime. The optically determined laser diode slope can be calculated directly from the first optical output power of the laser diode at the first laser diode current, and the second optical output power of the laser diode at the second laser diode current, different from the first laser diode current, above lasing threshold under predetermined conditions. The laser diode slope can be obtained by the difference of the first and the second optical output power of the laser diode over the difference of the first and the second laser diode current. As will be explained further below, the trimming laser diode slope of a laser diode characteristic curve may be determined non-inverted by the optical output power of the laser diode versus laser diode current of the laser diode or inverted by the laser diode current of the laser diode versus the optical output power of the laser diode. The inverse term may be beneficial for implementation in an ASIC since a division term can be avoided. As used herein, the term "optically determined" may denote a parameter determined, based on a measurement of the optical output power of the laser diode under the predetermined conditions.

Accordingly, the first optical trimming parameters may comprise an optically determined trimming laser threshold current ($I_{th\_trim\_opt}$) of a laser diode characteristic curve, indicative of an optical output power of the laser diode versus a laser diode current of the laser diode under the predetermined conditions. The optically determined trimming laser threshold current ($I_{th\_trim\_opt}$) can be determined from the optically determined trimming laser diode slope ($LD_{Slope\_trim\_opt}$), and at least, one of (a) the first optical output power of the laser diode at the first laser diode current, and (b) the second optical output power of the laser diode at the second laser diode current, and solving an equation for zero optical power. The threshold can be determined as, where an extrapolated straight line through (a) the first optical output power of the laser diode at the first laser diode current, and (b) the second optical output power of the laser diode at the second laser diode current intersects with zero optical output power. As indicated above, even though very similar, the optically determined threshold has been found to further improve the power control.

The optical output power of the laser diode is controlled based on the optically determined laser threshold current ($I_{th\_trim\_opt}$) and an electrically determined laser threshold current correction value ($\Delta I_{th\_el}$). In particular based on a sum of the optically determined laser threshold current ($I_{th\_trim\_opt}$) and the electrically determined laser threshold current correction value ($\Delta I_{th\_el}$). The laser threshold current correction value ($\Delta I_{th\_el}$) can be determined based on an electrical measurement. The optically determined threshold value can be provided during manufacturing, wherein the electrical determination can be carried out during operation in the field. During operation, the laser threshold current can thus be approximated by $i_{th\_trim\_opt}+\Delta I_{th\_el}$. An advantage of the specific combination an optically determined laser threshold current and merely considering an electrically determined laser threshold correction value is that, with this peculiar combination, the power control can be further improved while at the same time providing a cost-effective and reliable determination of the correction value during operation in the field.

In a further refinement, the laser threshold current correction value ($\Delta I_{th\_el}$) can be determined based on a difference between (a) an (electrically determined) trimming laser threshold current ($I_{th\_trim\_el}$) derived from a characteristic curve of the photodiode current versus laser diode current under the predetermined conditions and (b) an (electrically determined) operational laser threshold current ($I_{th\_el}$) determined during operation in the field. The operational laser threshold current may e.g. be derived from a characteristic curve of the photodiode current versus laser diode current. Hence, instead of using the already available optically determined laser threshold current ($I_{th\_trim\_opt}$), it is suggested to provide a further electrically determined laser threshold current ($I_{th\_trim\_el}$), and to determine the laser threshold current correction value based thereon. Thereby, the laser threshold current correction value ($\Delta I_{th\_el}$) can be determined more reliably and accurately. Optionally, a scaling factor and/or an offset may optionally be applied. For example, the laser threshold current correction value ($\Delta I_{th\_el}$) can be determined by scaling said difference by a scaling coefficient B1, and optionally adding an offset coefficient B2. The scaling factor and offset can be determined based on empirical measurements.

The optical output power may be controlled based on an optically determined trimming laser diode slope ($LD_{Slope\_trim\_opt}$) and an electrically determined laser diode slope correction value ($\Delta LD_{Slope\_el}$) above lasing threshold. For example, based on a sum of the optically determined trimming laser diode slope ($LD_{Slope\_trim\_opt}$) and the electrically determined laser diode slope correction value ($\Delta LD_{Slope\_el}$) above lasing threshold. The laser diode slope correction value ($\Delta LD_{Slope\_el}$) can be determined based on an electrical measurement. During operation, the laser diode slope above lasing threshold can thus be approximated by $LD_{Slope\_trim\_opt}+\Delta LD_{Slope\_el}$.

In an advantageous refinement, the laser diode slope correction value ($\Delta LD_{Slope\_el}$) above lasing threshold may be determined based on a photodiode slope correction value ($\Delta PD_{SlopeSE\_el}$) below lasing threshold. An advantage of this embodiment is that the correction value can be determined from an electrical measurement of the photodiode characteristic curve. The photodiode slope correction value ($\Delta PD_{SlopeSE\_el}$) below lasing threshold can be determined based on an electrical measurement. During operation, the photodiode slope below lasing threshold can thus be approximated by $PD_{SlopeSE\_trim\_el}+\Delta PD_{SlopeSE\_el}$. The photo diode slope is indicative of a photo diode current versus laser diode current. Surprisingly, it has been recognized that taking the slope of the photodiode below lasing threshold rather than above lasing threshold provides very accurate results for the laser diode slope above lasing threshold.

The laser diode slope correction value ($\Delta LD_{Slope\_el}$) above lasing threshold is determined based on $$\Delta LD_{Slope\_el}=A1*\Delta PD_{SlopeSE\_el}+A2,$$

wherein $\Delta PD_{SlopeSE\_el}$ is the photodiode slope correction value below lasing threshold, A1 is a scaling coefficient, and A2 is an offset coefficient, wherein $\Delta PD_{SlopeSE\_el}$ represents a difference between a slope of photodiode current versus laser current below lasing threshold under the predetermined conditions and a slope of photodiode current versus laser current upon measurement of the first and second photodiode currents below lasing threshold; wherein $\Delta LD_{Slope\_el}$ represents a difference between a slope of optical output power of the laser diode versus laser current above lasing threshold under the predetermined conditions and a slope of optical output power versus laser current above lasing threshold upon measurement of the first and second photodiode currents. The scaling factor A1 and the offset A2 can be determined based on empirical measurements. It shall be understood that the actual numerical values may vary between different types. The laser diode slope correction value can refer to a non-inverted or inverted value, depending on the implementation. As explained above, the inverse term may be beneficial for implementation in an ASIC since a division term may be avoided. When using an inverse term for the laser diode slope correction value, different scaling factor and offset may also be referred to as A3 for the scaling factor and as A4 for the offset.

The second electrical trimming parameters may comprise a slope of the photodiode current versus laser diode current below lasing threshold under the predetermined conditions ($PD_{SlopeSE\_trim\_el}$). The photodiode slope correction value ($\Delta PD_{SlopeSE\_el}$) above lasing threshold may be determined based on a difference between (a) the slope of the photodiode current versus laser diode current below lasing threshold under the predetermined conditions ($PD_{SlopeSE\_trim\_el}$) and (b) the slope of the photodiode current versus laser diode current below lasing threshold during operation in the field ($PD_{SlopeSE\_el}$). The photodiode slope correction value may thus be obtained from a difference between a characteristic curve of photodiode that is indicative of photodiode current of the photodiode versus a laser diode current of the laser diode below threshold during the trimming stage and the operational stage.

In an advantageous embodiment, the optical output power of the laser diode is controlled by setting a laser diode current $I_{LD}$ $$I_{LD}(P_{opt})=(I_{th\_trim\_opt}+\Delta I_{th\_el})+P_{opt}/(LD_{Slope\_trim\_opt}+LD_{Slope\_el});$$

wherein $I_{LD}$ ($P_{opt}$) is the laser diode current; $P_{opt}$ is the optical output power; $I_{th\_trim\_opt}$ is the optically determined laser threshold current, $\Delta I_{th\_el}$ is an electrically determined laser threshold current correction value; $LD_{Slope\_trim\_opt}$ is the optically determined laser diode slope; and $\Delta LD_{Slope\_el}$ is an electrically determined laser diode slope correction value. The respective values may be obtained as described above. An advantage of this embodiment is that the approach is not limited to adjust the optical output power of the laser diode during operation in the field so as to achieve the same optical output power as used during trimming stage for calibration of the device. Hence, it is possible to account for temperature variations and aging effects for a wide range of desired output powers $P_{opt}$. When using inverse values for the parameters $LD_{Slope\_trim\_opt}$ and $\Delta LD_{Slope\_el}$, the above equation may be rewritten as $$I_{LD}(P_{opt})=(I_{th\_trim\_opt}+I_{th\_el})+P_{opt}*(LD_{Slope\_trim\_opt,m1}+LD_{Slope\_el,m1});$$

wherein the optional suffix m1 highlights the use of inverted parameters. An advantage of using inverted parameters is that implementation in an ASIC can be more efficient since a division term may be voided.

The photodiode can be integrated with the laser diode. In particular, the laser diode can be a vertical cavity surface emitting laser, VCSEL, with integrated photodiode. Such devices are also briefly referred to as VIPs. The photodiode can be thermally coupled with the laser diode.

In contrast to known solutions in the prior art, and the proposed method, controlling the output power of the laser diode may not comprise a measurement of a laser diode voltage at a predetermined laser diode current during operation in the field. It has been found with the proposed more elaborate optical calibration during the trimming stage, the need for e.g. conducting a voltage measurement of the laser diode at a predetermined laser diode current is no longer needed. In view that adjustments during operation in the field occur much more often than calibration during trimming stage during manufacturing, the overall effort can thus be reduced.

It is to be understood that the features mentioned above and those yet to be explained below may be used not only in the combination respectively indicated, but also in other combinations or separately, without departing from the scope of the present invention.

In the following, exemplary embodiments of a method of controlling an optical output power of a laser diode and a system will be described.

FIG. 1 schematically shows an embodiment of a system according to the present invention. The system is therein denoted in its entirety by reference numeral 100. The system 100 comprises laser diode 10, photodiode 20 and a control device 30. The photodiode 20 is thermally coupled to the laser diode for example by a coupling element 21. In a preferred embodiment, the laser diode 10 is a vertical cavity surface emitting laser (VCSEL) comprising an integrated photodiode 20.

During operation, the laser diode emits light 11 leaving the laser diode but some light 12 is directed to the photodiode. Some of the light 11 may be scattered at particles in the field of view of the laser diode 10, may be back scattered to the device and lead to self mixing interference. A respective signal can be acquired by the photodiode 20 and evaluated by an evaluation unit, as for example described in more detail in U.S. Pat. No. 9,857,287 B2. The functionality of such an evaluation unit can be optionally performed by the control unit or control device 30. However, it is also possible that the separate evaluation unit is provided.

The control unit 30 is adapted to control an optical output power of the laser diode 10. In particular, the control unit is adapted to control the optical output power of the laser diode based on a method according to the present disclosure. Further details regarding the method steps will be described further below with reference to the flowcharts. The control unit 30 comprises an output for providing the drive signal to the laser diode 10. For example, the drive signal may be provided to a laser driver 32, such as a current source that provides a laser diode current $I_{LD}$ to the laser diode 10 for operating the laser diode 10. The laser driver 32 may be part of the control unit 30 or can be implemented as a separate device. Advantageously, a rather simple current source can be used since, with the proposed solution, there may be no need to measure the laser diode voltage.

The control unit 30 is very connected to the photodiode 20. A port 35 control unit can be provided for providing supply voltage to the photodiode and for measuring an output current of the photodiode 20. The control unit 30 can be directly connected to the photodiode 20 or via an intermediate unit 36 such as a controlled voltage source or for example he simply a shunt resistor for measuring a photodiode current. The photodiode 20 thus converts light 21 received from the laser diode 10 into an electrical photodiode current that can be measured, directly or indirectly, with the control unit 30.

An external powermeter 40 can be used during trimming stage for calibrating the control device 30 so as to provide a desired, well-controlled optical output power of the laser diode 10. It shall be understood that the power meter does not necessarily have to be directly connected to the control device but may also be part of manufacturing machinery and measuring equipment. With the use of the external power meter 40, it is possible to obtain highly reliable first optical trimming parameters indicative of a first optical output power of the laser diode at a first laser diode current and a second optical output power of the laser diode at a second laser diode current different from the first laser diode current, above lasing threshold under predetermined conditions.

It shall be understood that such trimming parameters may also be obtained by the control device 30 from an external database 50. The database 50 can be implemented as an external or internal memory.

Figure 2:
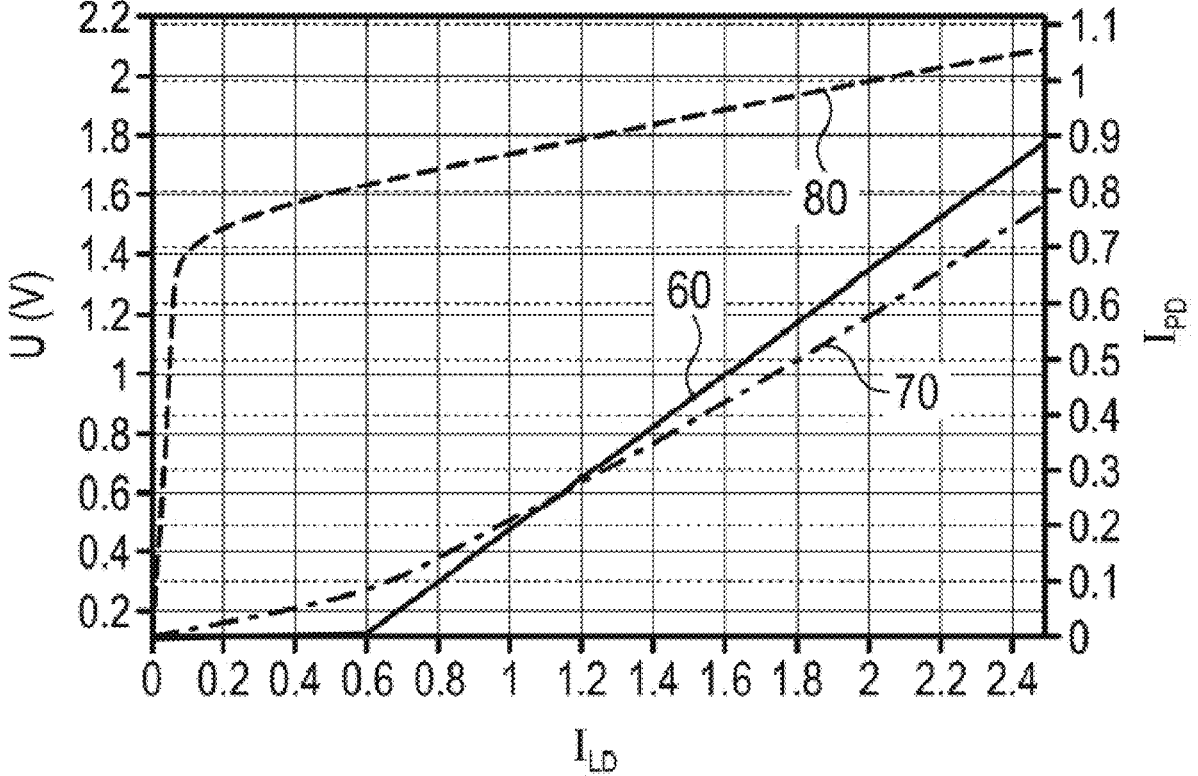
FIG. 2 shows a diagram of a laser diode characteristic curve, photodiode characteristic curve, and of the voltage of the laser diode versus laser diode current.

FIG. 2 shows a diagram of a laser diode characteristic curve 60, a photodiode characteristic curve 70, and a voltage 80 of the laser diode versus laser diode current. The horizontal axis denotes the laser diode current $I_{LD}$. The left vertical axis denotes the optical output power of the laser diode $P_{LD}$ or $P_{out}$. The right vertical axis denotes the photodiode current $I_{PD}$. The laser diode characteristic curve 60 thus describes the optical output power $P_{LD}$ of the laser diode versus the laser diode current $I_{LD}$. The photodiode characteristic curve 70 describes the laser diode current $I_{PD}$ versus the laser diode current $I_{LD}$.

Figure 3:
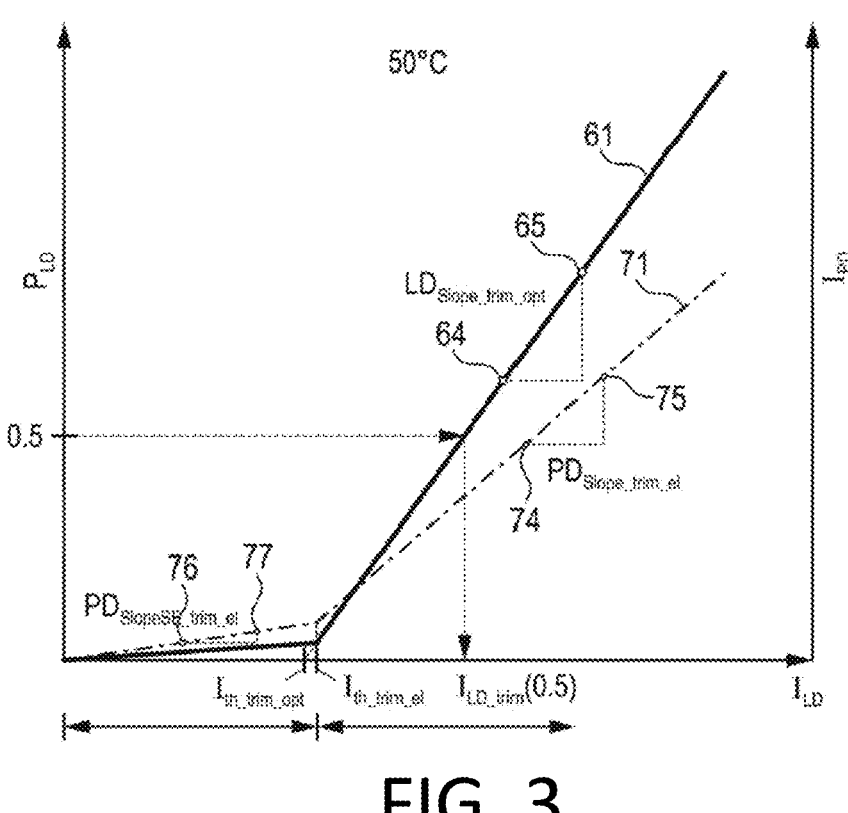
FIG. 3 shows a schematic diagram of a laser diode characteristic curve and a photodiode characteristic curve with certain parameters of interest during trimming stage under predetermined conditions at a first temperature.

FIG. 3 shows a simplified schematic diagram of laser diode characteristic curve 61 and photodiode characteristic curve 71 with certain parameters of interest during trimming stage under predetermined conditions at a first temperature of for example 50° C.

Figure 4:
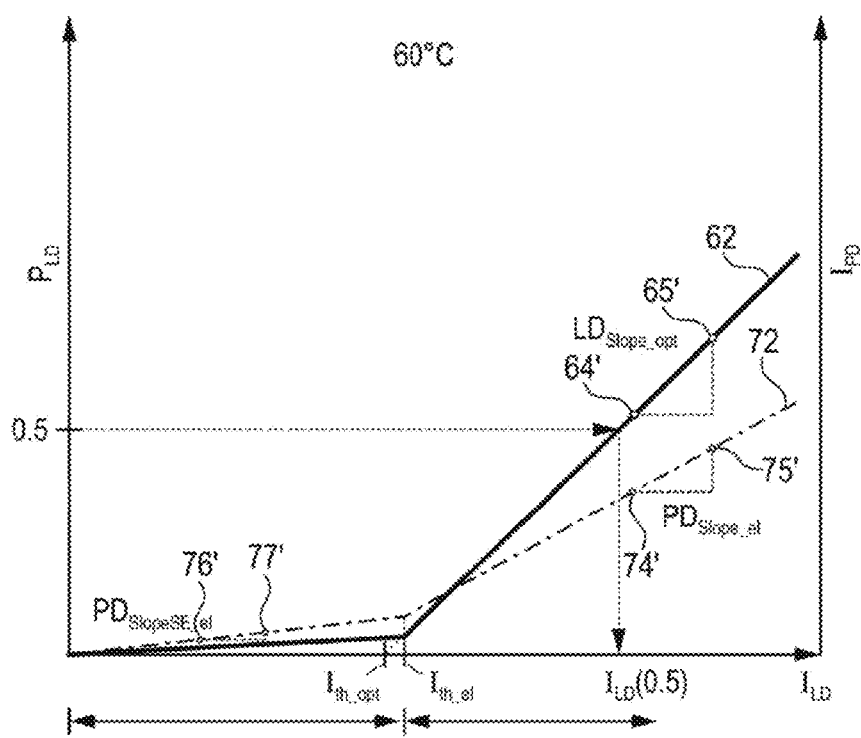
FIG. 4 shows a schematic diagram of a laser diode characteristic curve and a photodiode characteristic curve with certain parameters of interest during operational stage in the field at a second temperature different from the first temperature.

FIG. 4 shows a schematic diagram of laser diode characteristic curve 61' and photodiode characteristic curve 71' with certain parameters of interest during operational stage in the field at a second temperature different from the first temperature e.g. at a higher temperature of for example 60° C.

As can be seen from a comparison of the graphs, the threshold voltage of the laser diode $I_{th}$ increases with increasing temperature and the laser diode slope $LD_{Slope\_opt}$ or steepness of the curve of the laser diode decreases with increasing temperature. The same holds true for the slope of the photodiode slope $PD_{Slope\_el}$. Accordingly, a higher laser diode current $I_{LD}$ has to be applied to achieve a desired optical output power $P_{LD}$ of for example 0.5 mW. Hence, temperature and aging will change the laser diode threshold current, slope and voltage. For operation in the field, it is therefore important to know or at least estimate the difference or delta to the trimmed values to fully reconstruct the laser diode curve. From such a curve, a required drive current $I_{LD}$ can be calculated for every desired output power (e.g. 0.5 mW) $I_{th}$. An upper limit for drive currents that may be reasonably estimated may be due to a beginning of thermal roll-over.

Figure 5:
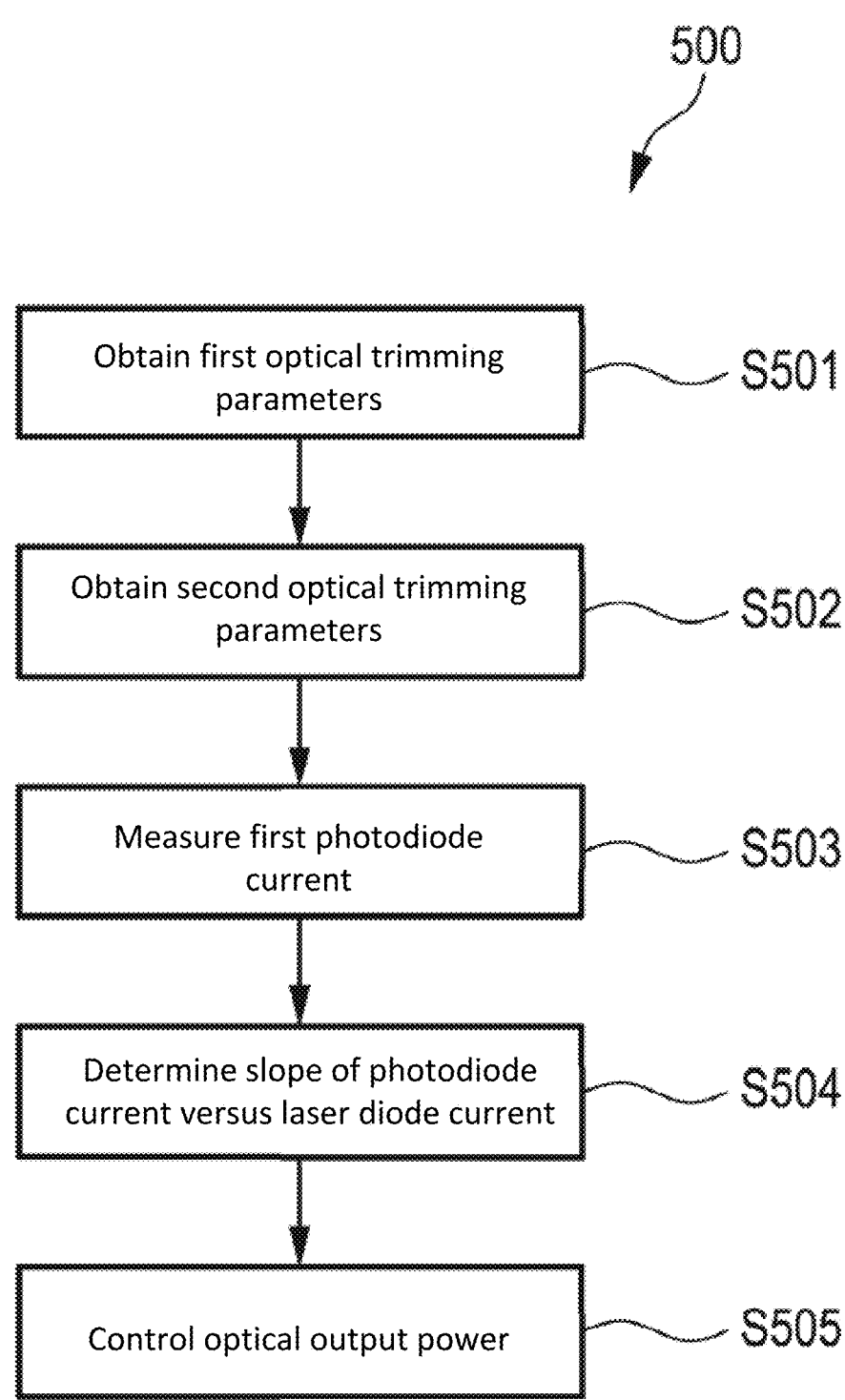
FIG. 5 shows a flow chart of a method according to an aspect of the present disclosure.

Further details will be described with reference to the flowchart shown in FIGS. 5 to 8. FIG. 5 shows a flow chart of a method 500 according to an aspect of the present disclosure. Steps S501 and S502 may be performed in a trimming stage during manufacturing under predetermined conditions e.g. at a defined temperature of e.g. 50°. Steps S503 to S505 may be performed during operation in the field where the operation conditions such as temperature may be unknown and/or after device aging.

In step S501 first optical trimming parameters are obtained. The optical trimming parameters can be indicative of a first optical output power of the laser diode at a first laser diode current (see item 64 in FIG. 3), and a second optical output power of the laser diode at a second laser diode current different from the first laser diode current (see item 65 in FIG. 3), above lasing threshold under predetermined conditions. Based thereon, an optically determined slope of the laser diode characteristic curve 61 during trimming $LD_{Slope\_trim\_opt}$ can be obtained. Based on this optical measurement, an optically determined laser threshold current $I_{th\_opt}$ can be obtained, as indicated in FIG. 3.

In step S502, second electrical trimming parameters can be obtained. The second optical trimming parameters can be indicative of a photodiode characteristic curve of photodiode current versus laser diode current 71 under the predetermined conditions. In particular, the second electrical trimming parameters may include measurements below the lasing threshold, indicated by "SE" for spontaneous emission below lasing threshold, and parameters measured above lasing threshold without the indication SE. For example, parameter indicative of a first photodiode current at a third laser diode current below lasing threshold (see item 76 in FIG. 3) and a second photodiode current at a fourth laser diode current below lasing threshold (see item 77 in FIG. 3). Based thereon, an electrically determined slope of the photodiode characteristic curve 71 during trimming $PD_{SlopeSE\_trim\_el}$ can be obtained below lasing threshold. Similarly, further measurements may be performed above lasing threshold (see items 73 and 74 in FIG. 3) and an electrically determined slope of the slope of the photodiode characteristic curve 71 during trimming $PD_{Slope\_trim\_el}$ can be obtained above lasing threshold. An estimation of the electrically determined laser diode threshold current $I_{th\_el}$ can be determined from a kink of the photodiode characteristic curve, e.g. by calculating the intersection of straight lines through items 76 and 77 on the one hand, and through items 73 and 74 on the other hand. It should be noted that the optically determined laser threshold current $I_{th\_el}$ may slightly deviate from the electrically determined laser threshold current $I_{th\_opt}$.

After this trimming stage, e.g. during manufacturing, steps S503 to S505 may subsequently be performed during operation in the field, e.g. under conditions leading to the photodiode and laser diode characteristic curves as indicated for FIG. 4. In step S503 a first photodiode current is measured at a third laser diode current below lasing threshold (see item 76' in FIG. 4). Further, a second photodiode current is measured at a fourth laser diode current different from the third laser diode current below lasing threshold (see item 77' in FIG. 4). The respective photodiode currents may be measured at the same or different laser diode currents as in FIG. 3. Accordingly, the measurement values 74' and 75' above lasing threshold may be obtained. The respective laser diode slope is shown for illustration but does not have to be measured during operation in the field.

In step S504, a slope $PD_{SlopeSE\_el}$ of a photodiode current versus laser diode current is determined based on said measurement of the first photodiode current and said second photodiode current below lasing threshold. The photodiode slope below lasing threshold is again denoted by "SE" for spontaneous emission.

In step S505, the optical output power of the laser diode above lasing threshold can then be controlled based on the first optical trimming parameters, the second electrical trimming parameters and the slope of the photodiode current versus laser diode current below lasing threshold. Further details of an exemplary embodiment will now be described with reference to FIG. 6 to FIG. 8.

Figure 6:
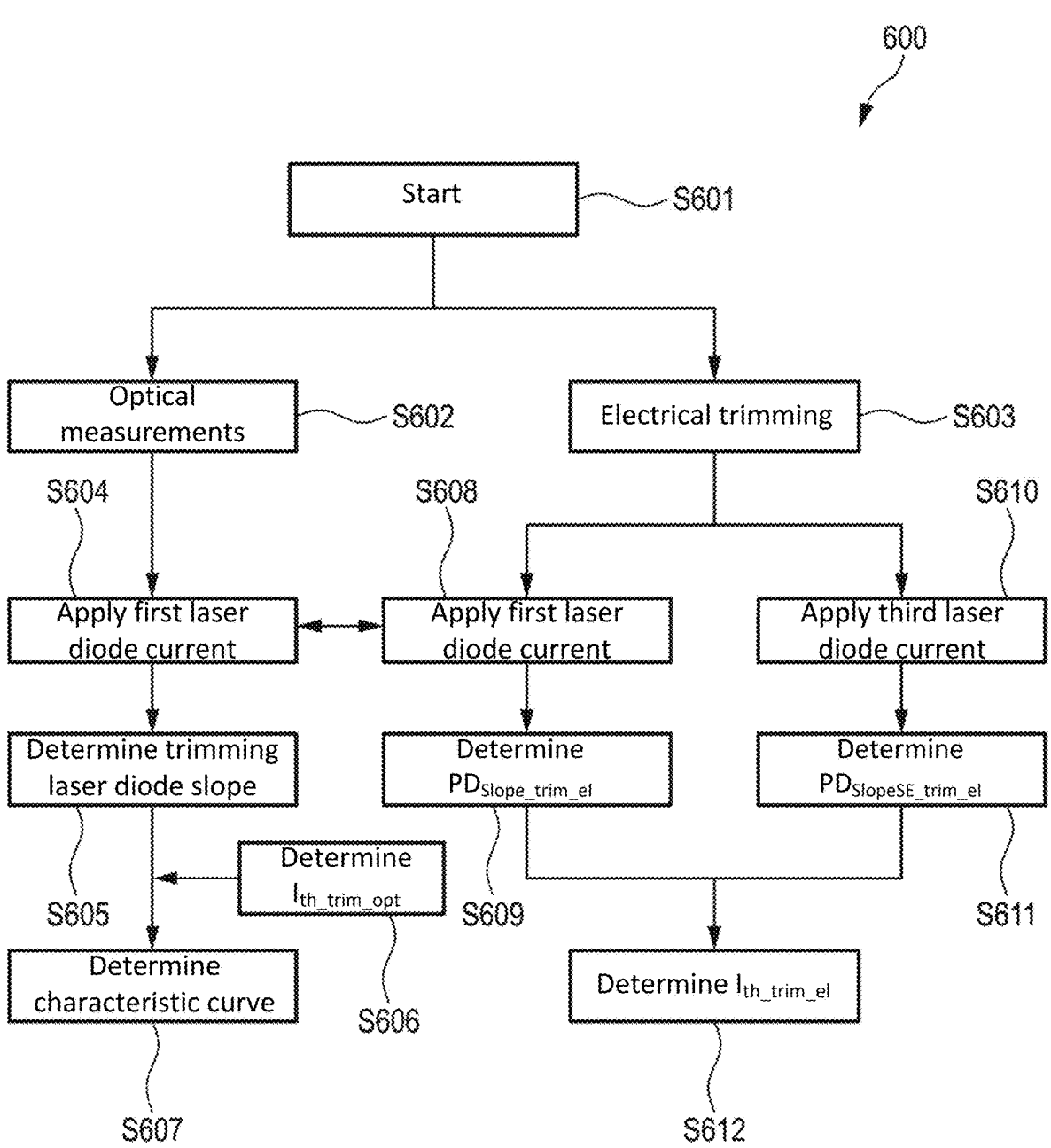
FIG. 6 shows a flowchart of exemplary method steps during trimming stage.

FIG. 6 shows a flowchart of exemplary method steps 600 during trimming stage. The trimming procedure starts at step S601. The left branch indicated by S602 refers to optical measurements, whereas the right branch of the flow chart, indicated by S603, refers to electrical trimming steps. In step S604 a first laser diode current is applied to the laser diode above lasing threshold and under predetermined conditions. An optical output power of the laser diode at said first laser diode current is measured (see item 64 in FIG. 3). Further, in step S604, a second laser diode current different from the first laser diode current is applied to the laser diode above lasing threshold and under predetermined conditions. An optical output power of the laser diode at said second laser diode current is measured (see item 65 in FIG. 3). In step S605, a trimming laser diode slope (LD$_{Slope\_trim\_opt}$) of a laser diode characteristic curve indicative of an optical output power of the laser diode versus a laser diode current of the laser diode under the predetermined conditions is determined based on said measurements. In step S606 e.g. a linear equation for zero optical output can be solved to determine an optically determined trimming laser threshold current (I$_{th\_trim\_opt}$) of a laser diode characteristic curve indicative of an optical output power of the laser diode versus a laser diode current of the laser diode under the predetermined conditions in step S607.

Referring to the right branch in FIG. 6, in step S608 a first laser diode current is applied to the laser diode above lasing threshold and under predetermined conditions. A photodiode current at said first laser diode current is measured (see item 74 in FIG. 3). Further, in step S608, a second laser diode current different from the first laser diode current is applied to the laser diode above lasing threshold and under predetermined conditions. A photodiode current of the laser diode at said second laser diode current is measured (see item 75 in FIG. 3). Advantageously, steps S604 and S608 can be performed in parallel, i.e., the same first and second laser diode current above lasing threshold are applied and the respective optical output powers and photodiode currents may be measured in parallel. However, it is also possible to apply different laser diode currents in steps S604 and S608. Based on said measurements, the electrically determined photodiode slope during trimming PD$_{Slope\_trim\_el}$ can be determined in step S609.

Accordingly, in step S610 a third laser diode current is applied to the laser diode below lasing threshold and under the predetermined conditions. A photodiode current at said third laser diode current is measured (see item 76 in FIG. 3). Further, in step S610, a fourth laser diode current different from the third laser diode current is applied to the laser diode below lasing threshold and under predetermined conditions. A photodiode current of the laser diode at said fourth laser diode current is measured (see item 77 in FIG. 3). Based on said measurements, the electrically determined photodiode slope during trimming PD$_{SlopeSE\_trim\_el}$ below lasing threshold, i.e. during spontaneous emission (SE) can be determined in step S611. In step S612, an electrically determined or more precisely estimated threshold current for the laser diode I$_{th\_trim\_el}$ can be determined based on the aforementioned measurements, e.g. as illustrated in FIG. 3.

Figure 7:
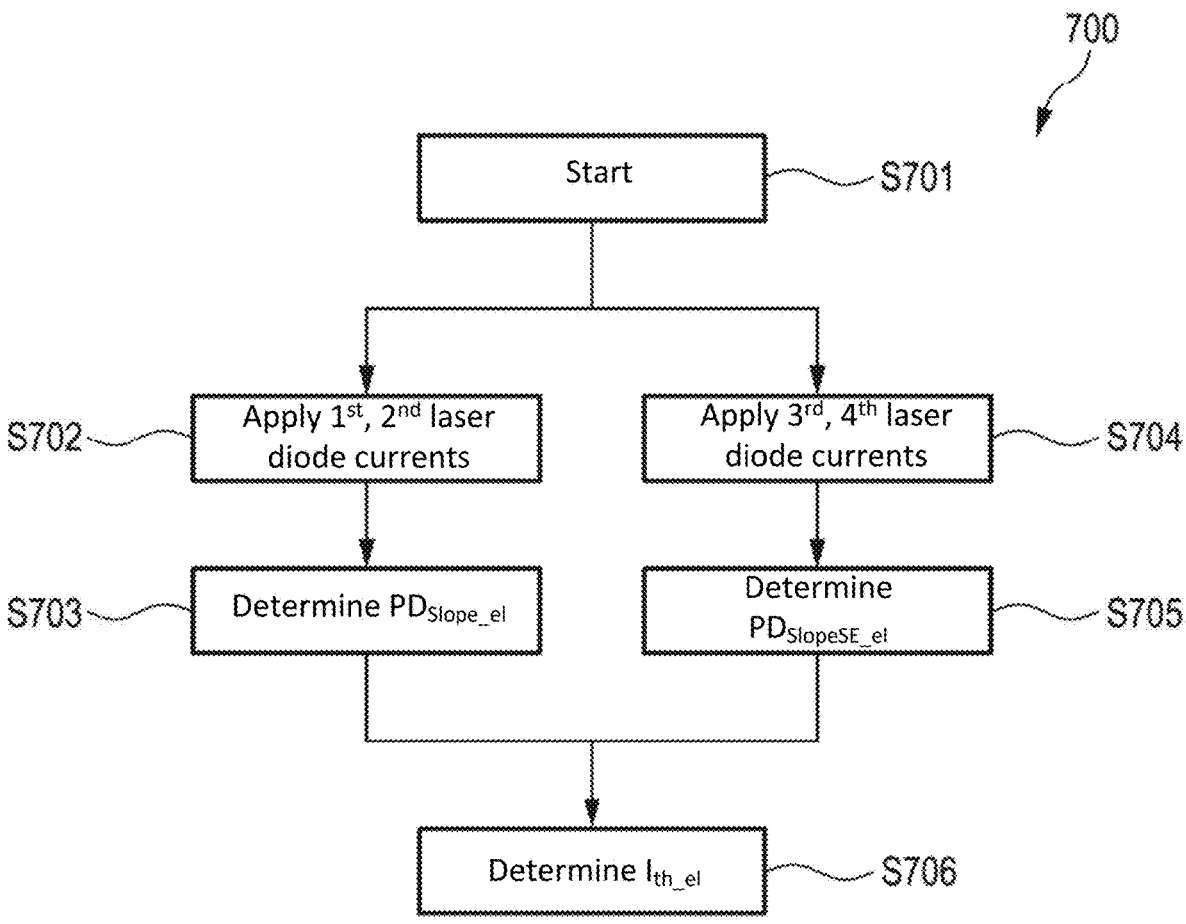
FIG. 7 shows a flowchart of exemplary method first steps during operational stage.
Figure 8:
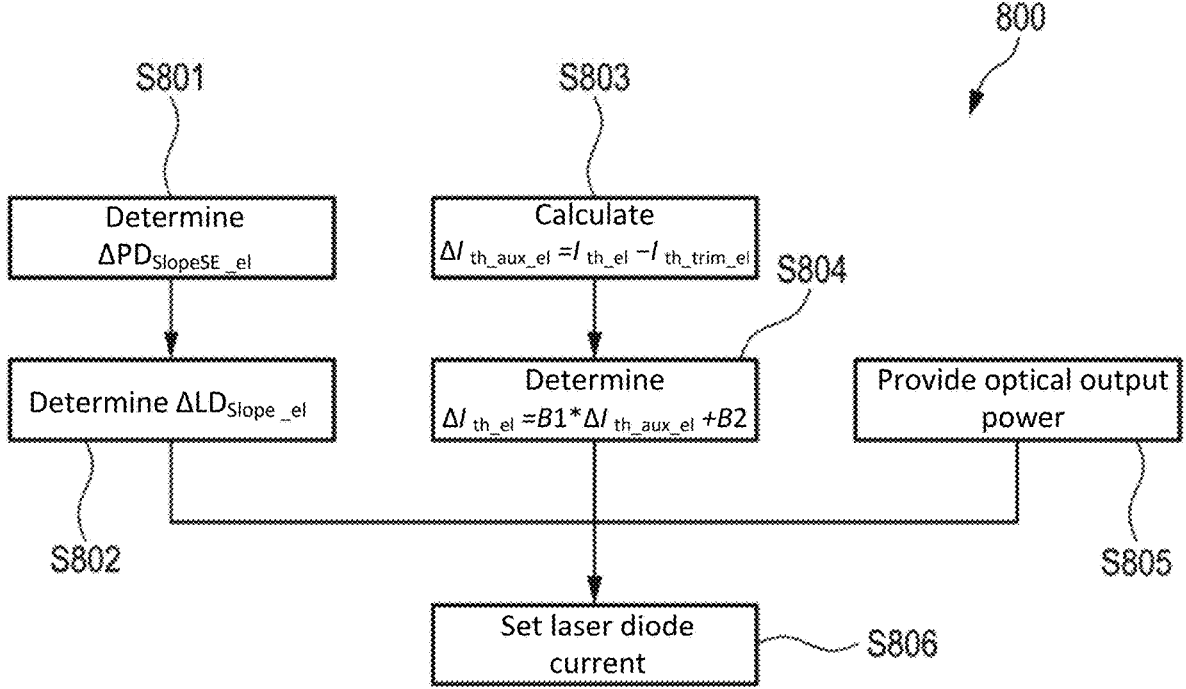
FIG. 8 shows a flowchart of exemplary method second first steps during operational stage.

FIGS. 7 and 8 illustrate method steps during operational conditions for example after releasing a particle sensor device comprising a respective VCSEL with integrated photodiode into the field. In the method described herein, no measurement of a laser diode voltage at a predetermined laser diode current during operation in the field. Hence, the calibration procedure can be simplified. Moreover, the circuit design may also be simplified since the device does not have to be adapted to perform a respective voltage measurement of the laser diode.

In FIG. 7 the electrical measurement as described in the right branch in FIG. 6 may be repeated, however this time during operation of the device in the field under unknown conditions (FIG. 7) instead of the trimming measurement under well-controlled predetermined conditions during manufacturing (FIG. 6). Accordingly, after starting in step S701, in step S702 a first laser diode current is applied to the laser diode above lasing threshold during operation in the field. A photodiode current at said first laser diode current is measured (see item 74' in FIG. 4). Further, in step S702, a second laser diode current different from the first laser diode current is applied to the laser diode above lasing threshold during operation in the field. A photodiode current of the laser diode at said second laser diode current is measured (see item 75' in FIG. 4). Based on said measurements, the electrically determined photodiode slope in the field PD$_{Slope\_el}$ can be determined in step S703.

Accordingly, in step S704 a third laser diode current is applied to the laser diode below lasing threshold during operation in the field. A photodiode current at said third laser diode current is measured (see item 76' in FIG. 4). Further, in step S704, a fourth laser diode current different from the third laser diode current is applied to the laser diode below lasing threshold during operation in the field. A photodiode current of the laser diode at said fourth laser diode current is measured (see item 77' in FIG. 4). Based on said measurements, the electrically determined photodiode slope in the field PD$_{SlopeSE\_el}$ below lasing threshold, i.e. during spontaneous emission (SE) can be determined in step S705. In step S706, an electrically determined or more precisely estimated threshold current for the laser diode I$_{th\_el}$ can be determined based on the aforementioned measurements, e.g. as illustrated in FIG. 4.

The electrically determined laser threshold can also be referred to as an alternative threshold current which may be determined based on the kink in the photodiode characteristic, as shown in FIGS. 3 and 4 respectively.

FIG. 8 shows a flow chart of further method steps 800 subsequent to the method steps shown in FIG. 7. In step S801, a photodiode slope correction value (ΔPD$_{SlopeSE\_el}$) below lasing threshold is determined based on a difference between (a) the slope of the photodiode current versus laser diode current below lasing threshold under the predetermined conditions (PD$_{SlopeSE\_trim\_el}$), i.e. the result of step S611 in FIG. 6, and (b) the slope of the photodiode current versus laser diode current below lasing threshold during operation in the field (PD$_{SlopeSE\_el}$), i.e. the result of step S705 in FIG. 7. For example as $$PD_{SlopeSE\_el} = PD_{SlopeSE\_el} - PD_{SlopeSE\_trim\_el}.$$

In step S802, the laser diode slope correction value (ΔLD$_{Slope\_el}$) above lasing threshold can be is determined based on $$\Delta LD_{Slope\_el} = A1 * \Delta PD_{SlopeSE\_el} + A2,$$

wherein ΔPD$_{SlopeSE\_el}$ is the photodiode slope correction value below lasing threshold, A1 is a scaling coefficient and A2 is an offset coefficient. The coefficients may be determined empirically or based on simulations. Hence, the correction value for the laser diode slope above lasing threshold is determined based on a correction value of the photodiode slope below lasing threshold.

In step S803 and S804, a laser threshold current correction value (ΔI$_{th\_el}$) is determined based on a difference between (a) a trimming laser threshold current (I$_{th\_trim\_el}$) derived from a characteristic curve of the photodiode current versus laser diode current under the predetermined conditions and (b) an operational laser threshold current (I$_{th\_el}$) derived from a characteristic curve of the photodiode current versus laser diode current during operation in the field. In step S803, an auxiliary laser threshold correction value may, e.g., be calculated $$\Delta I_{th\_aux\_el} = I_{th\_el} - I_{th\_trim\_el}.$$

In step S804, the laser threshold current correction value may then be determined by applying an optional scaling factor B1 and/or offset B2 based on:

$$\Delta I_{th\_el} = B1 * \Delta I_{th\_aux\_el} + B2$$

In step S805, a desired or target optical output power to be provided by the laser diode is provided. The optical output power is preferably chosen such that the device, e.g. an optical particle sensor, may operate within eye safety limits.

In step S806, the optical output power of the laser diode is controlled by setting a laser diode current $I_{LD}$ for a desired optical output power. The laser diode current can be calculated by $$I_{LD}(P_{opt}) = I_{th} + P_{opt}/LD_{Slope};$$

wherein $I_{LD}$ ($P_{opt}$) is the laser diode current; $P_{opt}$ is the optical output power;

$I_{th}$ is the laser threshold current (during operation);

$LD_{Slope}$ is the laser diode slope (during operation).

More precisely, the optical output power of the laser diode can be controlled by setting a laser diode current $I_{LD}$ $$I_{LD}(P_{opt}) = (I_{th\_trim\_opt} + \Delta I_{th\_el}) + P_{opt}/(LD_{Slope\_trim\_opt} + \Delta LD_{Slope\_el});$$

wherein $I_{LD}$ ($P_{opt}$) is the laser diode current; $P_{opt}$ is the optical output power;

$I_{th\_trim\_opt}$ is the optically determined laser threshold current;

$\Delta I_{th\_el}$ is an electrically determined laser threshold current correction value;

$LD_{Slope\_trim\_opt}$ is the optically determined laser diode slope;

$\Delta LD_{Slope\_el}$ is an electrically determined laser diode slope correction value.

In an embodiment, an inverse term for laser diode slope may be used to avoid the division term. The term $LD_{Slop,m1} = 1/LD_{Slope}$ is introduced, thus $I_{LD}$ ($P_{opt}$) = $I_{th}$ + $P_{opt}*LD_{Slope,m1}$ results. This may allow an efficient implementation in an application specific integrated circuit (ASIC). Similar as for the non-inverted term, the inverse term can be written as $LD_{Slope,m1} = 1/LD_{Slope\_trim\_opt} + \Delta LD_{Slope\_el,m1} = LD_{Slope\_trim\_opt,m1} + \Delta LD_{Slope\_el,m1}$, wherein $LD_{Slope\_trim\_opt,m1}$ is the inverse of the optically determined laser diode slope. In step S605 an inverse trimming laser diode slope ($LD_{Slope\_trim\_opt,m1}$) of a laser diode characteristic curve indicative of an optical output power of the laser diode versus a laser diode current of the laser diode under the predetermined conditions may thus be determined. Similarly, in step S802, an inverse laser diode slope correction value ($\Delta LD_{Slope\_el\_m1}$) above lasing threshold can be is determined based on $$\Delta LD_{Slope\_el,m1} = A3*\Delta PD_{SlopeSE\_el} + A4,$$

wherein $\Delta PD_{SlopeSE\_el}$ is the photodiode slope correction value below lasing threshold, A3 is a scaling coefficient and A4 is an offset coefficient. Surprisingly, it has been found that $\Delta LD_{Slope\_el,m1}$ can be determined based on the non-inverted $\Delta PD_{SlopeSE\_el}$ photodiode slope correction value below lasing threshold. The coefficients may be determined empirically or based on simulations. Hence, the correction value for the inverse of the laser diode slope above lasing threshold is determined based on a correction value of the photodiode slope below lasing threshold. It should be noted that generally $\Delta LD_{Slope\_el,m1} \neq 1/\Delta LD_{Slope\_el}$. Nonetheless, the above approach surprisingly has been found to allow control of the laser output power with high accuracy while allowing an efficient implementation in an ASIC. It should further be noted that the term describing the threshold current can remain unchanged. As a result the optical output power of the laser diode can be controlled by setting a laser diode current $I_{LD}$ $$I_{LD}(P_{opt}) =$$
$$(I_{th\_trim\_opt} + \Delta I_{th\_el}) + P_{opt}*(LD_{Slope\_trim\_opt,m1} + \Delta LD_{Slope\_el,m1}) =$$
$$(I_{th\_trim\_opt} + B1*\Delta I_{th\_aux\_el} + B2) +$$
$$P_{opt}*(LD_{Slope\_trim\_opt,m1} + A3*\Delta PD_{SlopeSE\_el} + A4)$$

wherein $I_{LD}$ ($P_{opt}$) is the laser diode current; $P_{opt}$ is the optical output power;

$I_{th\_trim\_opt}$ is the optically determined laser threshold current;

$\Delta I_{th\_el}$ is an electrically determined laser threshold current correction value;

$LD_{Slope\_trim\_opt,m1}$ is the inverse optically determined laser diode slope;

$\Delta LD_{Slope\_el,m1}$ is the electrically determined laser inverse diode slope correction value.

As a further advantage of this approach, the parameter set can be further reduced for a given optical output power $P_{opt}$, because B2 and $P_{opt}*A4$ can be combined to one constant. The number of constants may thus decrease from 4 to 3.

In conclusion, the proposed solution may thus provide a further improved approach for controlling an optical output power of a laser diode. In particular, the circuit design may be simplified, since a voltage measurement of a laser diode voltage may no longer be needed during operation in the field. Moreover, in view of the reduced number of measurements required in the field, a setup or calibration procedure may be more time-efficient.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

A computer program may be stored/distributed on a suitable non-transitory medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method of controlling an optical output power of a laser diode associated with a photodiode, wherein the photodiode converts light received from the laser diode into an electrical photodiode current; the method comprising the steps of:

obtaining first optical trimming parameters indicative of a first optical output power of the laser diode at a first laser diode current and a second optical output power of the laser diode at a second laser diode current different from the first laser diode current, wherein the first and second laser diode currents are above lasing threshold under predetermined calibration conditions;

obtaining second electrical trimming parameters indicative of a photodiode characteristic curve of photodiode current versus laser diode current under the predetermined calibration conditions;

measuring a first photodiode current at a third laser diode current below lasing threshold;

measuring a second photodiode current at a fourth laser diode current different from the third laser diode current below lasing threshold;

determining a slope of a photodiode current versus laser diode current based on the measurement of the first photodiode current and the second photodiode current below lasing threshold;

controlling the optical output power of the laser diode above lasing threshold based on the first optical trimming parameters, the second electrical trimming parameters and the slope of the photodiode current versus laser diode current below lasing threshold.

2. The method as claimed in claim 1, wherein the obtaining of the first optical trimming parameter comprises measuring a characteristic curve of the laser diode indicative of an optical output power of the laser diode versus a laser diode current of the laser diode.

3. The method as claimed in claim 1, wherein the first optical trimming parameters comprise an optically determined trimming laser diode slope ($\text{LD}_{Slope\_trim\_opt}$) of a laser diode characteristic curve indicative of an optical output power of the laser diode versus a laser diode current of the laser diode under the predetermined calibration conditions.

4. The method as claimed in claim 1, wherein the first optical trimming parameters comprise an optically determined trimming laser threshold current ($\text{I}_{th\_trim\_opt}$) of a laser diode characteristic curve indicative of an optical output power of the laser diode versus a laser diode current of the laser diode under the predetermined calibration conditions.

5. The method as claimed in claim 4, wherein the optical output power of the laser diode is controlled based on the optically determined laser threshold current ($\text{I}_{th\_trim\_opt}$) and an electrically determined laser threshold current correction value ($\Delta\text{I}_{th\_el}$), wherein the laser threshold current correction value ($\Delta\text{I}_{th\_el}$) is determined based on an electrical measurement.

6. The method as claimed in claim 5, wherein the laser threshold current correction value ($\Delta\text{I}_{th\_el}$) is determined based on a difference between a trimming laser threshold current ($\text{I}_{th\_trim\_el}$) derived from a characteristic curve of the photodiode current versus laser diode current under the predetermined calibration conditions and an operational laser threshold current ($\text{I}_{th\_el}$) determined during operation in the field.

7. The method as claimed in claim 3, wherein the optical output power is controlled based on an optically determined trimming laser diode slope ($\text{LD}_{Slope\_trim\_opt}$) and an electrically determined laser diode slope correction value ($\Delta\text{LD}_{Slope\_el}$) above lasing threshold, wherein the laser diode slope correction value ($\Delta\text{LD}_{Slope\_el}$) is determined based on an electrical measurement.

8. The method as claimed in claim 7, wherein the laser diode slope correction value ($\Delta\text{LD}_{Slope\_el}$) above lasing threshold is determined based on a photodiode slope correction value ($\Delta\text{PD}_{SlopeSE\_el}$) below lasing threshold, wherein photodiode slope correction value ($\Delta\text{PD}_{SlopeSE\_el}$) below lasing threshold is determined based on an electrical measurement.

9. The method as claimed in claim 8, wherein the laser diode slope correction value ($\Delta\text{LD}_{Slope\_el}$) above lasing threshold is determined based on $$\Delta\text{LD}_{Slope\_el} = A1 * \Delta\text{PD}_{SlopeSE\_el} + A2,$$

wherein $\Delta\text{PD}_{SlopeSE\_el}$ is the photodiode slope correction value below lasing threshold, A1 is a scaling coefficient and A2 is an offset coefficient, wherein $\Delta\text{PD}_{SlopeSE\_el}$ represents a difference between a slope of photodiode current versus laser current below lasing threshold under the predetermined conditions and a slope of photodiode current versus laser current upon measurement of the first and second photodiode currents below lasing threshold; wherein $\Delta\text{LD}_{Slope\_el}$ represents a difference between a slope of optical output power of the laser diode versus laser current above lasing threshold under the predetermined conditions and a slope of optical output power versus laser current above lasing threshold upon measurement of the first and second photodiode currents.

10. The method as claimed in claim 8, wherein the second electrical trimming parameters comprise a slope of the photodiode current versus laser diode current below lasing threshold under the calibration predetermined conditions ($\text{PD}_{SlopeSE\_trim\_el}$); and wherein the photodiode slope correction value ($\Delta\text{PD}_{Slope\_trim\_el}$) below lasing threshold is determined based on a difference between (a) the slope of the photodiode current versus laser diode current below lasing threshold under the predetermined calibration conditions ($\text{PD}_{SlopeSE\_trim\_el}$) and (b) the slope of the photodiode current versus laser diode current below lasing threshold during operation in the field ($PD_{Slope\_SE\_el}$).

11. The method as claimed in claim 1, wherein the optical output power of the laser diode is controlled by setting a laser diode current $I_{LD}$ $$I_{LD}(P_{opt})=(I_{th\_trim\_opt}+\Delta I_{th\_el})+P_{opt}/(LD_{Slope\_trim\_opt}+\Delta LD_{Slope\_el});$$

wherein $I_{LD}$ ($P_{opt}$) is the laser diode current; $P_{opt}$ is the optical output power;

$I_{th\_trim\_opt}$ is the optically determined laser threshold current;

$\Delta I_{th\_el}$ is an electrically determined laser threshold current correction value;

$LD_{Slope\_trim\_opt}$ is the optically determined laser diode slope;

$\Delta LD_{Slope\_el}$ is an electrically determined laser diode slope correction value.

12. The method as claimed in claim 1, wherein the photodiode is integrated with the laser diode, in particular wherein the laser diode is a vertical cavity surface emitting laser, VCSEL, with integrated photodiode.

13. The method as claimed in claim 1, wherein controlling the output power of the laser diode does not comprise a measurement of a laser diode voltage at a predetermined laser diode current during operation in the field.

14. A control device for controlling an optical output power of a laser diode, wherein the laser diode is associated with a photodiode, wherein the photodiode converts light received from the laser diode into an electrical photodiode current; wherein the control device is adapted to perform the steps of:

obtaining first optical trimming parameters indicative of a first optical output power of the laser diode at a first laser diode current and a second optical output power of the laser diode at a second laser diode current different from the first laser diode current, wherein the first and second laser diode currents are above lasing threshold under predetermined calibration conditions;

obtaining second electrical trimming parameters indicative of a photodiode characteristic curve of photodiode current versus laser diode current under the predetermined calibration conditions;

obtaining a first measurement value of a first photodiode current at a third laser diode current below lasing threshold;

obtaining a second measurement value of a second photodiode current at a fourth laser diode current different from the third laser diode current below lasing threshold;

determining a slope of a photodiode current versus laser diode current based on the measurement of the first photodiode current and the second photodiode current below lasing threshold;

providing a control parameter for controlling the optical output power of the laser diode above lasing threshold based on the first optical trimming parameters, the second electrical trimming parameters and the slope of the photodiode current versus laser diode current below lasing threshold.

15. A system comprising a photodiode, a laser diode and a control device adapted to control an optical output power of the laser diode based on the method of claim 1.

16. The method as claimed in claim 2 wherein the optical output power is measured with a calibrated external powermeter.

* * * * *